(12) United States Patent
Waltari et al.

(10) Patent No.: US 7,737,875 B2
(45) Date of Patent: Jun. 15, 2010

(54) TIME INTERPOLATION FLASH ADC HAVING AUTOMATIC FEEDBACK CALIBRATION

(75) Inventors: Mikko Waltari, San Diego, CA (US); Costantino Pala, San Diego, CA (US)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 12/270,609

(22) Filed: Nov. 13, 2008

(65) Prior Publication Data
US 2009/0153388 A1    Jun. 18, 2009

Related U.S. Application Data

(63) Continuation-in-part of application No. 12/002,153, filed on Dec. 13, 2007, now Pat. No. 7,557,746.

(51) Int. Cl.
*H03M 1/34* (2006.01)
*H03M 1/50* (2006.01)

(52) U.S. Cl. ...................... 341/158; 341/166

(58) Field of Classification Search ............... 341/155, 341/156, 158, 159, 166
See application file for complete search history.

(56) References Cited

U.S. PATENT DOCUMENTS

| 4,611,194 | A  | * | 9/1986  | Konig et al. ............... 341/122 |
| 4,928,103 | A  | * | 5/1990  | Lane ........................ 341/159 |
| 5,157,397 | A  | * | 10/1992 | Vernon ...................... 341/159 |
| 5,291,198 | A  | * | 3/1994  | Dingwall et al. ............. 341/159 |
| 5,945,935 | A  | * | 8/1999  | Kusumoto et al. ........... 341/159 |
| 6,707,413 | B2 | * | 3/2004  | Sushihara et al. ........... 341/159 |
| 7,379,007 | B2 | * | 5/2008  | Noguchi .................... 341/155 |
| 7,420,497 | B2 | * | 9/2008  | Chiu ........................ 341/155 |
| 7,557,746 | B1 | * | 7/2009  | Waltari ..................... 341/158 |

FOREIGN PATENT DOCUMENTS

JP          04043718 A   *   2/1992

* cited by examiner

*Primary Examiner*—Howard Williams (57) ABSTRACT

An input signal is compared to $2^N-1$ reference voltages to generate $2^N-1$ corresponding binary valued comparison signals, delaying at least one of the comparison signals by a variable delay and detecting a difference in arrival time between the delayed signal and another comparison signal. A time interpolation signal encoding a plurality of bins within a least significant bit quantization level is generated, based on the detected difference in arrival time. An M-bit output data is generated based on the comparison signals and the time interpolation signal. A non-uniformity of a code density of the M-bit output data is detected, and based on the detecting the delaying is varied.

15 Claims, 3 Drawing Sheets

TIME INTERPOLATION FLASH ADC HAVING AUTOMATIC FEEDBACK CALIBRATION

This application is a continuation-in-part of U.S. application Ser. No. 12/002,153, filed Dec. 13, 2007.

TECHNICAL FIELD

Embodiments relate generally to analog-to-digital conversion circuits and more particularly, relate to flash analog-to-digital conversion circuits.

BACKGROUND

In a basic form, an N-bit flash analog-to-digital (A/D) converter (hereinafter referred to as "ADC") has $2^N-1$ comparators, arranged in cardinal order to compare the same input signal against a respective cardinal order of $2^N-1$ equally spaced reference voltages. The voltage spacing between each comparator and its adjacent higher and/or lower comparator is typically one least significant bit (LSB) of the N-bit output.

In operation, all of the $2^N-1$ comparators receive the same sampling clock (typically periodic at a sampling rate) and, at each clock pulse, generate a broadside output of "1s" from all comparators (if any) for which the signal exceeds the reference voltage, and a "0" from all comparators (if any) having higher reference voltages. The broadside output of the $2^N-1$ comparators is sometimes referred to as "thermometer code" encoding, because it can be visualized as similar to a liquid column thermometer, where the liquid (e.g., mercury) rises to a point corresponding to the temperature.

A decoding logic decodes the broadside of binary outputs to generate a binary N-bit data representing, in the cardinal ordering of the $2^N-1$ comparators, which from the comparators generating a "1" has the highest reference voltage. Stated differently, if the comparators generating "1s" are considered as a thermometer column, the decoding logic generates a binary N-bit data representing the "top" comparator of the column.

One significant feature of flash ADCs is speed. ADCs enable high speed conversion because, in basic form, each sample requires only one clock. This differs from other known ADC architectures such as, for example, successive approximation (SAR) ADCs that use a plurality of clock cycles to convert the signal.

However the number of comparators required to construct prior art flash ADCs is exponentially related to the number of bits. Simply put, N bits of resolution requires $2^N-1$ comparators.

As an illustration, a basic 4-bit flash ADC (assuming the output "bit" is binary valued) converts the input into one of 16 levels and, therefore, requires 15 comparators (a zero value does not require a comparator). An 8-bit flash ADC requires 255 voltage comparators. With current state-of-the art A/D technology, economical implementation of 255 comparators and all the required support circuitry in an acceptable size and acceptable power consumption package is readily attained. A 10-bit true flash ADC, meaning 10 bits in a single clock, requires 1023 comparators.

This requirement for $2^N-1$ comparators causes multiple problems.

One problem is that each comparator requires chip area and, therefore, as a rough estimate, each one bit increase in resolution may require approximately a doubling of the chip area.

Another problem is that clocked comparator circuits have various capacitances, and current flows are required to charge and discharge these capacitances. As a rough estimator, each one bit increase in resolution may approximately double the power dissipation. For reasons well known to persons skilled in the art, these power issues may manifest significantly at higher sampling rates.

Another problem arising from the requirement for $2^N-1$ comparators is that, for ideal performance (meaning maximum sampling rate and minimal noise and distortion), the input amplifier to a flash ADC must deliver high current at a fast slew rate. The reason is that the input of each of the $2^N-1$ comparators has a capacitance. A multi-stage, fan-out arrangement of buffers may not be acceptable because these introduce various distortions, and bandwidth reduction. For this reason, it is often preferable when striving for a maximum speed and accuracy flash ADC that a single amplifier output directly connects to all of the signal level comparators. In such instances the input amplifier must effectively drive a load of $2^N-1$ parallel capacitors.

Still other problems, both additional to and exacerbating of the above example problems of structural overhead (e.g., power dissipation, and input amplifier demands), is that the present requirement for $2^N-1$ comparators necessarily introduces noise and linearity problems. Basically, each doubling of the number of bits halves the voltage difference between successive comparators. This, in turn, reduces tolerance for comparator inaccuracy, and increases susceptibility to noise-induced error by the comparators. Still further, circuit technologies and design methods directed to controlling such comparator accuracy and noise problems, in addition to direct cost, often require a compromising of ADC cost.

Methods to lessen or ameliorate some of these problems have been identified and, in certain instances, some may be used. All, however, have significant costs.

One example of such methods is the subranging ADC. In a basic form, a subranging ADC performs an N-bit quantizing using a multiple step sequence. Generally, each additional step provides a theoretical increase of one bit of resolution, using substantially the same number of signal level comparators. However, subranging ADCs have costs. Reduced quantizing speed is foremost, and is significant. Each additional step reduces the maximum speed by two. Distortion and noise arising from the lengthened "hold" time of the internal sample-and-hold circuitry is another problem.

SUMMARY

It will be understood that, unless otherwise stated or made clear from the context to mean otherwise, the term "X-bit flash ADC," where "X" is any character, means a flash ADC that, with a one cycle of a one-phase clock, converts an input signal to a binary X-bit sample data.

It will be further understood that, unless otherwise stated or made clear from the context to mean otherwise, the term "X-bit flash ADC," as used herein, encompasses any X-bit A/D section, or any equivalent X-bit resolution quantizing section, of any other ADC having, for example, more than X bits of resolution.

The present invention provides, among other features and benefits, a flash ADC employing just $2^N-1$ signal level comparators connected to $2^N-1$ reference voltages, in a novel structure and arrangement to generate a stream of M-bit data samples, where M is an integer greater than N, with each M-bit sample requiring only one comparison against the $2^N-1$ signal level comparators.

Various exemplary embodiments provide, among other features and benefits, a flash ADC having, for any given quantity of signal level comparators and reference voltages, a higher number of bits of resolution than attainable with present state of the art flash ADCs.

One embodiment provides a flash analog-to-digital converter, comprising: a flash comparator portion to compare an input signal to $2^N-1$ reference voltages and to generate $2^N-1$ corresponding binary valued comparison signals, wherein adjacent comparison signals represent a given least significant bit quantization level; a time interpolating encoder to detect a difference in arrival time between a first comparison signal and a second comparison signal from among the binary valued comparison signals and, based on the difference, to generate a voltage interpolation signal capable of encoding a plurality of bins within the given least significant bit quantization level, and capable of identifying which of the bins corresponds to the input signal, wherein the time interpolating decoder includes at least one variable delay unit to delay, based on a control signal, at least one of the first comparison signal and the second comparison signal prior to detecting said difference; a decoder to generate an M-bit output data representing an M-bit quantization of the input signal, M being greater than N, based on the binary valued comparison signals and the voltage interpolation signal; and a feedback control signal generator to generate the control signal, the generator including a code density detector to detect a non-uniformity of a code density of the M-bit output data, wherein the generator generates the control signal based on the detecting.

One embodiment provides a flash analog-to-digital converting method, comprising: comparing an input signal to $2^N-1$ reference voltages and to generate $2^N-1$ corresponding binary valued comparison signals, wherein adjacent comparison signals represent a given least significant bit quantization level; detecting a difference in arrival time between a first comparison signal and a second comparison signal from among the binary valued comparison signals and, based on the difference, generating a first-to-arrive signal, wherein the detecting includes delaying at least one of the first comparison signal and the second comparison signal prior to detecting said difference; generating a voltage interpolation signal capable of encoding a plurality of bins within the given least significant bit quantization level, and capable of identifying which of the bins corresponds to the input signal, said generating based on said first-to-arrive signal; generating an M-bit output data representing an M-bit quantization of the input signal, M being greater than N, based on the binary valued comparison signals and the voltage interpolation signal; detecting a non-uniformity of a code density of the M-bit output data and generating a corresponding uniformity error data; and generating a feedback control signal based on the uniformity error data, According to one or more aspects of these and other various exemplary embodiments, the code density calibrating controller measures a uniformity of the code density and generates the control signal to vary the delay duration in a direction increasing the uniformity measure.

As described in greater detail in later sections, one or more aspects according to various exemplary embodiments having variable delays based on a code density detection, provide an automatic, feedback-based linearity calibration having K additional bits of resolution compared a conventional flash ADC.

Achieving K additional bits of resolution, without requiring additional signal level comparators, removes significant performance limitations inherent to previous flash ADCs. For example, among other benefits and features, the present invention enables additional bits of resolution without substantial, if any, increase in the capacitive load seen by the input amplifier driving the ADC.

The above-summarized advances and features of the invention are only examples of those provided by the various exemplary embodiments, and are not intended to be exhaustive or limiting of the possible advantages that may be realized.

These and other advantages of the various exemplary embodiments will be apparent from the description herein, and can be learned from practicing systems and method including one or more of the various exemplary embodiments, both as illustrated and specifically described herein and as modified in view of any variation that becomes apparent to those skilled in the art.

DESCRIPTION

Certain embodiments, features, aspects, and illustrative examples for practicing the invention are described. The description is of the invention. To avoid obscuring novel features and aspects, and to readily provide persons skilled in the relevant arts a complete understanding of the invention, the description may omit various details of methods and techniques known to such persons which, upon reading this description, will be readily identifiable by such persons as applicable in practicing the claimed invention.

It will be understood that the particular examples are only for facilitating understanding of the invention by way of illustrative example and, further, that the invention is not limited to the specific examples described and depicted by the attached drawings. Other configurations and arrangements can, upon reading this description, be readily recognized and implemented by persons skilled in the relevant arts.

Various embodiments and aspects may be described separately and/or as having certain differences. Separate description, and/or description of certain differences, however, does not necessarily mean the embodiments or aspects are mutually exclusive. For example, a particular feature, function, or characteristic described in relation to one embodiment may be included in, or adapted for other embodiments.

The description refers to accompanying drawings, which form a part of this description.

It will be understood that like numerals appearing in different drawings reference functional blocks or items that are, or may be, identical or substantially identical between the different drawings, whether of the same or different embodiments. However, it will also be understood that, unless otherwise stated or made clear from a particular context, different numerals appearing in different do not mean the respective functions or items cannot be functionally, or structurally identical.

According to various exemplary embodiments, an ADC generates an M-bit binary code using only a single comparison against $2^N-1$ reference voltages, where N is an integer less than M.

Examples of Generating N Most Significant Bits of the M-Bit Flash ADC Output

One example, illustrative of one general embodiment, will be described. Illustrative examples of alternatives and variations are described in greater detail later sections.

In one example, $2^N-1$ signal level comparators are arranged, each connecting to one of the $2^N-1$ reference voltages. The $2^N-1$ reference voltages may be generated by, for example, a conventional voltage divider circuit of the type used in a conventional N-bit flash ADC. The voltage difference between adjacent signal level comparators is a given reference voltage, Vref, divided by $2^N$. It will be understood that this voltage difference is the same as the voltage represented by one least significant bit of a conventional N-bit flash ADC having its required $2^N-1$ reference voltages and signal level comparators. This voltage difference is referred to in this description as NLSB.

An input signal connects through, for example, a conventional low-noise buffer amplifier, to a "+" input of each of the $2^N-1$ signal level comparators. Each of the $2^N-1$ signal level comparators also has a "−" input, which is connected to the comparator's corresponding reference voltage. It will be understood that the labels of "+" and "−" referencing the inputs of the signal level comparators are arbitrary. As will be understood by persons skilled in the art upon reading this description, the assignment of which of the inputs is "−" and which is "+," as well as which signal level of the signal level comparator represents which comparison result of the input signal connected to one of the "+" and "−" inputs of the signal level comparators, and the reference signal connected to other of the "+" and "−" inputs, is a design choice, readily made by such persons using the know-how such persons possess, applied to the teachings of this disclosure.

In one example, a sample clock connects to all of the signal level comparators. The sample clock may be, but is not necessarily periodic, having a clock rate F and a clock period of 1/F=T.

In response to a defined sampling event, e.g., a leading or trailing edge of the clock, each of the $2^N-1$ signal level comparators generates a comparator signal which, in this example, is a binary signal having one of two levels, one representing logical "0" and the other representing logical "1." In one example, a logical "0" is generated if, at a sampling time relative to the sampling event, the input signal is less than the comparator's associated reference voltage, and a logical "1" is generated if, at that sampling time, the input signal is greater than or equal to the comparator's associated reference voltage. The respective output of each of the signal level comparators is hereinafter referred to as the "comparison result signal." For purposes of focusing the description on the concepts enabling persons skilled in the relevant arts to practice the invention, the sampling time will be treated as concurrent with the sampling event. Persons skilled in the relevant arts, however, applying conventional know-how to this disclosure, can readily identify and adjust for delays between the sampling event (e.g., the rising or falling edge of the sampling clock) and the sampling instant.

As will be apparent to persons skilled in the relevant arts, when used to describe a rule or operation of a signal level comparator's output with respect to input signal and the reference signal at the sampling event, the terms "less than," "equal to" and "greater than," are not necessarily limited to their strict arithmetical meaning. The reason, which will be understood by persons skilled in the relevant arts, is that actually constructed signal level comparators cannot achieve a strict arithmetical comparison at an infinitely precise moment of time. Such persons, however, upon reading this description, can apply know-how possessed by such persons to this description, and readily specify signal level comparators' respective characteristics for "equal to," "less than," and "greater than," sufficient to practice the invention.

As will be described in greater detail in later sections, for purposes of extracting and encoding additional information from the signal level comparators' respective comparison result signals, to form the M−N lower bits of the M-bit final output, for each signal level comparator's comparison result signal, a "positive" and a "negative" version must be generated. It will be understood that "positive" and "negative" mean in a logical sense, not necessarily in a voltage polarity sense. As will be described in greater detail, the "positive" and "negative" comparison result signals may be generated by the signal level comparators, or by particular circuitry receiving comparison result signals.

In this one example, the "positive" comparison result signals from the $2^N-1$ signal level comparators may connect to a final M-bit decoder having, in addition to other described functions, an N-bit decoder function comparable to the thermometer decoder of a conventional flash ADC. The N-bit decoder output forms the upper N bits of the M-bit output.

Examples of Time Interpolation Generating of M−N Least Significant Bits

As described above in reference to one example, the $2^N-1$ "positive" comparison result signals from the $2^N-1$ signal level comparators may connect to an N-bit decoder function such as, for example, a thermometer decoder circuit of a conventional flash ADC, to form the upper N bits of the M-bit output of a flash ADC according to the various exemplary embodiments.

Each sampling event causes the stack of signal level comparators to generate a broadside of comparison result signals, forming a column of "0s" above a thermometer column of "1s".

In one example, an M-bit flash ADC includes a time interpolation decoder to extract and encode the relative timing between generation of the "1" by the signal level comparator at the top of the thermometer column of "1s" and the generation of the "0" by the next higher signal level comparator, and then decode this to form the M−N lower bits of the final M-bit output.

It will be understood that the term "thermometer column," and terms "higher" and "lower," when used in reference to such a column, are only for purposes of describing a function by analogy to images of visual-based instruments, and have no meaning as to any relative physical positioning of the signal level comparators.

In one example, an M-bit flash ADC includes at least $2^N-2$ lower level time interpolation decoders, one for each pair of immediately successive signal level comparators. The number may be $2^N-2$ because, according to one example, a lower level time interpolation encoder may, but is not necessarily omitted in relation to signals less than one NLSB, i.e., for signals above relative ground but less than the signal level comparator receiving the smallest reference voltage.

In one example, each of the signal level generators may be constructed to generate a "positive" comparison result signal and a "negative" comparison result signal. The signal level comparators may be constructed to generate, in response to the input signal being less than the reference voltage, a "positive" comparison result signal of "0" and a negative comparison result signal of "1."

The signal level comparators may be constructed to generate, in response to the sampling event (e.g., rising edge or falling edge of the sampling clock) a "1" as one of its "positive" and "negative" comparison result signals.

The signal level comparators may be constructed to generate the "1," which is one from among its "positive" and "negative" comparison result signals, to have a leading edge having a delay with respect to the sampling event. The delay is referenced hereinafter as the "comparison sampling delay." The signal level comparators may be constructed so that the comparison sampling delay, at least over a given range of voltages, varies proportionally to the difference between the input signal voltage and the reference voltage connected to the signal level comparator. Preferably, the signal level comparators are constructed to provide a proportional relation between the voltage difference and the comparison sampling delay that is monotonic, over at least a given range of voltage difference values. The signal level comparators may be constructed to have a proportionality relation that may be, but is not necessarily, an inverse relationship.

Figure 1:
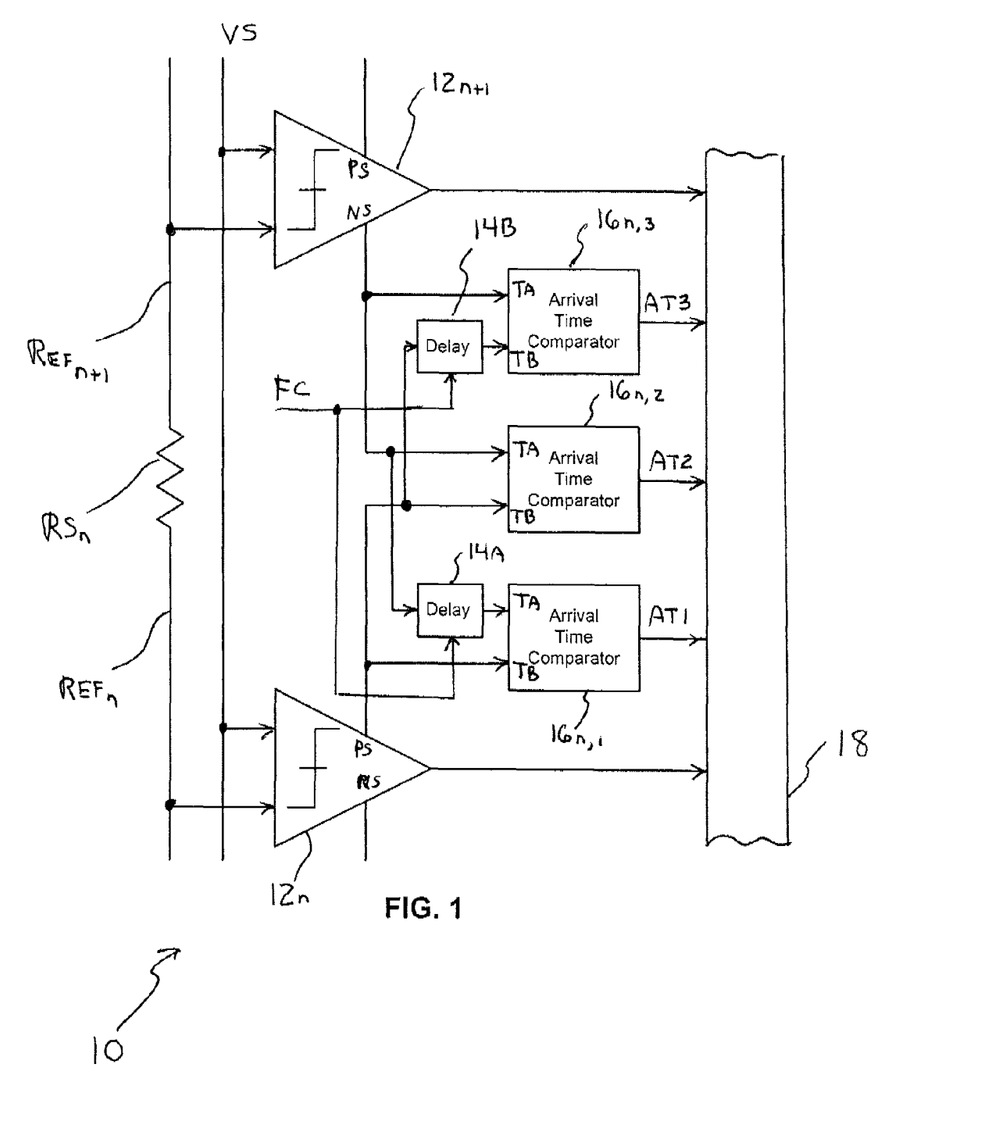
FIG. 1 shows one example flash ADC portion having quantizing based on signal level comparators, having time interpolation sub-quantization with negative feedback calibration.

FIG. 1 shows one example flash ADC portion 10 having quantizing based on example signal level comparators, having one example of time interpolation sub-quantization, or decoding, with one example negative feedback calibration.

Referring now to FIG. 1, one example time interpolating encoder 10 will now be described in reference to a particular, arbitrary pair of immediately successive signal level comparators, labeled $12_n$ and $12_{n+1}$, respectively. The successive signal level comparators $12_n$ and $12_{n+1}$ form part of the stack of $2^N-1$ signal level comparators producing the N MSBs of an M-bit flash ADC according to the present invention.

It will be understood, with respect to labeling and referencing, that signal level comparator $12_n$, when described in relation to certain illustrative operations of the time interpolating encoder shown at FIG. 1, will be termed the "Level n" signal level comparator. Similarly, signal level comparator $12_{n+1}$, described in relation to certain illustrative operations, will be termed the "Level n+1" signal level comparator. The voltage at line $REF_n$, which is the line below the voltage drop resistance $RS_n$, may be referenced as $V_n$. The voltage at line $REF_{n+1}$, which is the line above the voltage drop resistance $RS_n$, may be referenced as $V_{n+1}$. It will be assumed that $V_{n+1}$ is one NLSB higher than $V_n$.

With continuing reference to FIG. 1, the example low level time interpolating encoder 10 of FIG. 1 comprises the "positive" and "negative," or complementary, output arrangement PS and NS of the signal level comparators $12_n$ and $12_{n+1}$, a first controllable delay (CD) unit 14A and a second CD unit 14B, and a first, a second, and a third arrival time detector, labeled $16_{n,1}$, $16_{n,2}$, and $16_{n,3}$, respectively, arranged as depicted. The first and second controllable delay units 14A and 14B may be, but are not necessarily voltage controlled delay units. As will be apparent to persons skilled in the art, the signal controlling the delay units 14A and 14B, labeled "FC" and described in greater detail in later sections, must have a format compatible with the particular implementation of the delay units.

As will be described in greater detail in later sections, the first and second controllable delay units 14A and 14B, and the three arrival time comparators $16_{n,1}$, $16_{n,2}$, and $16_{n,3}$ exploit an inverse proportional relation in the sample comparison delay for each of the signal level comparators $12_n$ and $12_{n+1}$, with respect to the distance of the input signal voltage VS from the comparators' respective reference voltages, $V_n$ and $V_{n+1}$. As will also be described in greater detail in later sections, the controllable delay units 14A and 14B, and the three arrival time comparators $16_{n,1}$, $16_{n,2}$, and $16_{n,3}$, by detecting the relative generation of time of the outputs from the level n signal level comparator $12_n$ and the level n+1 comparator $12_{n+1}$, resolve the voltage gap between $V_n$ and $V_{n+1}$ into four (4) preferably equal voltage regions, and generate signals AT1, AT2 and AT3 encoding which of the regions that VS is within. A decoder such as 18 of FIG. 1 uses AT1, AT2 and AT3 of each of the stack of encoders 10 to generate two additional bits of resolution. This is two more bits than available from a prior art flash ADC, with no additional clock cycles and no additional comparators.

As will understood, the number of delay units (for example the FIG. 1 example having two—14A and 14B) and the number of arrival time comparators (for example the FIG. 1 example having three—$16_{n,1}$, $16_{n,2}$, and $16_{n,3}$) dictates the number of added bits of resolution.

Referring to the FIG. 1 example, which provides two additional bits of resolution (i.e., by resolving the voltage gap from $V_n$ and $V_{n+1}$ (which is one NSLB) into four (4) preferably equal voltage regions), the delay imposed by the first and second units 14A and 14B can be described. For purposes of describing an example operation, the four (4) preferably equal voltage regions can be referred to as "¼ NSLB bins" or "¼ bins" and the bin closest to $V_n$ can be called the "first" ¼ bin, while the bin closest to $V_{n+1}$ can be called the "fourth" ¼ bin.

With continuing reference to FIG. 1, the first arrival time detector unit $16_{n,1}$ is configured to output AT1 as a "0" if, after the sample event, its TA input arrives first, but to output a "1" if its TB input arrives first. Each of the second and third arrival time detector units $16_{n,2}$ and $16_{n,3}$ is likewise configured.

As described previously, it is assumed for the FIG. 1 example 10 that the relation of the comparison sample delay to the voltage difference is an inverse proportional relation. Therefore, assuming the level n+1 signal level comparator $12_{n+1}$ has a time delay characteristic identical to that of the level n signal level comparator $12_n$, if VS is closer to $V_n$ than to $V_{n+1}$ then, after a given sample event, the negative output NS of the level n+1 signal level comparator $12_{n+1}$ will occur before the positive output PS of the level n signal level comparator $12_n$. Therefore, provided VS is closer to $V_n$ than the $V_{n+1}$ (i.e., VS is in the first ¼ bin or the second ¼ bin) the middle arrival time comparator $16_{n,2}$, which receives its TA and TB inputs without any delay, receives the NS output of the level n+1 signal level comparator $12_{n+1}$ before it receives the PS of the level n signal level comparator $12_n$. Therefore, as can be seen (assuming the $16_{n,2}$ configuration of generating "0" and "1" based on TA and TB as described above), so long as VS is closer to $V_n$ than to $V_{n+1}$ (i.e., VS is in the first ¼ bin or second ¼ bin) the middle time comparator $16_{n,2}$ outputs AT1 as a "0." On the other hand, when VS is at the midpoint between $V_n$ and $V_{n+1}$, or is closer to $V_{n+1}$, (i.e., VS is in the third ¼ bin or fourth ¼ bin) the middle arrival time comparator $16_{n,2}$ will receive the NS output of the level n+1 signal level comparator $12_{n+1}$ concurrently with, or after it receives the PS of the level n signal level comparator $12_n$. The second arrival time comparator $16_{n,2}$ therefore outputs AT 1 as a "1" when VS is in the third ¼ bin or the fourth ¼ bin.

As is readily apparent, the second arrival time comparator $16_{n,2}$ alone adds one additional bit of resolution, indicating whether VS is in: (a) a lower ½ bin consisting of the first and second ¼ bins, or (b) an upper ½ bin consisting of the third and fourth ¼ bin.

As described above, because of the inverse proportion relation of the comparison sample delay, for any of the signal level comparators $12_n$ and $12_{n+1}$, with respect to the distance of VS from the comparator's reference voltage, as VS increases from $V_n$ toward $V_{n+1}$, the comparison sample delay of $12_n$ decreases, while the comparison sample delay of $12_{n+1}$ increases. As also described above, the change is not necessarily linear, but must be monotonic.

The delay units 14A and 14B, and the first and third arrival time detectors the $16_{n,1}$, and $16_{n,3}$ further exploit this inverse proportional relation in the sample comparison delay characteristic of the signal level comparators $12_n$ and $12_{n+1}$, to resolve VS with respect to the distance of the input signal voltage VS from $V_n$ and $V_{n+1}$ into which of the ¼ bins that VS falls.

Referring to FIG. 1, delay unit 14A provides for resolving the lower ½ NSLB bin into a first ¼ bin and second ¼ bin. The delay unit 14A provides for this by delaying NS from the n+level signal level comparator $12_{n+1}$ so that the delayed NS $12_{n+1}$ will arrive first at the first unit arrival time detector $16_{n,1}$, in other words before the PS output from $12_{n+1}$, but maintains this relation of arrival time until VS reaches the bisecting point of the lower half of the gap between $V_n$ and $V_{n+1}$, in other words only until VS reaches $V_n+¼(V_{n+1}-V_n)$, or $V_n+¼$ NSLB.

With continuing reference to FIG. 1, the first arrival time detector unit $16_{n,1}$ is configured to output AT1 as a "0" if its TA input is received before its TB input, and a "1" if its TB input is first. Therefore, provided the delay unit 14A is set to impart the correct delay, anytime VS is in the first ¼ bin, the input TA of the first arrival time detector unit $16_{n,1}$, receives NS from $12_{n+1}$ first, and arrival time detector unit $16_{n,1}$, outputs AT1 as a "0," and anytime VS is in the second ¼ bin (or at the boundary of the first and second ¼ bins) TB of the first arrival time detector unit $16_{n,1}$ receives PS from $12n$ first, and arrival time detector unit $16_{n,1}$ outputs AT1 as a "1."

Still referring to FIG. 1, the delay unit 14B is set in the same manner, so that, anytime VS is in the third ¼ bin, TA of the third arrival time detector unit $16_{n,1}$ receives PS from $12_n$ first, and arrival time detector unit $16_{n,3}$ outputs AT2 as a "0," and anytime VS is in the fourth ¼ bin (or at the boundary of the third and fourth ¼ bins) the input TB of the third arrival time detector unit $16_{n,3}$ receives NS from $12_{n+1}$ first, and arrival time detector unit $16_{n,3}$ outputs AT2 as a "1."

Referring to FIG. 1, each of the example time interpolating encoders 10 generates, as described above, three additional code signals, labeled AT1, AT2, and AT3 that encode the position of the input signal VS in relation to the one NLSB voltage gap between $V_{n+1}$ and $V_n$, according to the four ¼ bin regions. The decoder 18, in addition to decoding the thermometer column of 1s generated by the stack of signal level comparators (which include the comparators $12_n$, and $12_{n+1}$) to generate the N most significant bits of M bits, also decodes these four positions represented by AT1, AT2, and AT3, into the two least significant bits of the M bits.

As described above, the delay imposed by the first delay unit 14A must be such that anytime VS is in the first ¼ bin TA of the first arrival time detector unit $16_{n,1}$ receives NS from the level n+1 signal level comparator $12_{n+1}$ first, but anytime VS is in the second ¼ bin (or at the boundary of the first and second ¼ bins) TB of the first arrival time detector unit $16_{n,1}$ receives PS from n level signal level comparator $12_n$ first. Therefore, only when the delay of 14A is correct does the arrival time detector unit $16_{n,1}$ accurately output AT1, namely as a "0" when VS is in the first ¼ bin, and as a "1" when VS is in the second ¼ bin (or at the boundary of the first and second ¼ bin). Likewise, the delay imposed by the second delay unit 14B must be such, that anytime VS is in the third ¼ bin, TA of the third arrival time detector unit $16_{n,3}$ receives PS from $12_n$ first, and anytime VS is in the fourth ¼ bin (or at the boundary of the third and fourth ¼ bins) TB of the third arrival time detector unit $16_{n,3}$ receives NS from $12_{n+1}$ first. Therefore, only when the delay of 14A is correct does the third arrival time detector unit $16_{n,3}$ accurately output AT3 as a "0" when VS is in the third ¼ bin and output AT3 as a "1" anytime VS is in the fourth ¼ bin (or at the boundary of the third and fourth ¼ bin).

Referring to FIG. 1, the operation of the control signal FC is readily apparent. Basically, the control signal FC changes the position of VS at which the first arrival time comparator $16_{n,1}$ changes AT1 from a "0" to a "1" and changes the position of VS at which the third arrival time comparator $16_{n,3}$ changes AT3 from a "0" to a "1." In other words FC changes the actual "bisecting" point of the lower ½ bin (which is defined by AT2) which, in turn, defines the first and second ¼ bins, and changes the actual "bisecting" point of the upper ½ bin (defined by AT2) which, in turn, defines the third and fourth ¼ bins.

For purposes of focusing the description on the inventive concepts to enable persons of ordinary skill in the art to practice the invention, it can be assumed that all of the signal level comparators 12 have the same relation between comparison sample delay and the difference between VS and the comparator's reference voltage. Likewise, for the same purpose, it can be assumed that all of the controllable delay units (e.g., 14A and 14B of any of the N encoders 10) have the same characteristic of delay with respect to FC. Therefore, it may be assumed that all of the controllable delay units are fed by one FC signal. However, it will be readily apparent to persons of ordinary skill in the art upon reading this disclosure that such a person can apply know-how possessed by such persons to this description, and readily specify acceptable statistics for uniformity of the controllable delay units, and/or uniformity of the relation between comparison sample delay and VS, and can identify and can apply means to compensate such as, for example, additional individual delay elements (not shown).

As will be apparent to persons skilled in the relevant arts, the FIG. 1 example 10, having CD units 14A and 14B, combined with the first and third arrival time comparators $16_{n,1}$ and $16_{n,3}$, bisecting each of the upper and lower ½ bin regions between $V_n$ and $V_{n+1}$ into two ¼ bin regions is only one example. Additional CDs and arrival time comparators $16_n$ may be added to further divide each of the four regions again, into two smaller regions (each one-half the width of the previous) and, if desired, divide each of these, again, into two smaller regions. Each division adds another bit of resolution. As can be understood, one general representative model for K additional bits of resolution is to provide $2^{K-1}-1$ nominally different delays for the level n comparator $12_n$ output, and to provide $2^{K-1}-1$ nominally different delays for the level n+1 comparator $12_{n+1}$ output. Stated differently, for each different length of delay, two delay units must be provided, one to delay the level n comparator $12_n$ output and one to delay the negative (e.g. NS) of the level n+1 comparator $12_{n+1}$ output. In the FIG. 1 example 10, K is equal to two and, therefore, only one delay length is required, as each of CDs 14A and 14B impose the same delay of ¼ of a bit.

The different delays do not necessarily require a different kind of structure for the different elements, provided that one structure can be controlled over the entire range. It must be understood, however, that the "FC" must be different for each of delay lengths. As an illustrative example, if K is 3, there may be a group of two delay elements (not shown) to shift the interpolation level (e.g., the PS output of the level n comparator $12_n$ and the NS output of the level n+1 comparator $12_{n+1}$ output, by ⅛ NLSB, a group of two delay elements to perform ¼ NLSB shift, and a group of two delay elements to perform a ⅜ NLSB shift.

As described above, every group ($2^{K-1}$–1 total) of such delay elements may require its own feedback signal (comparable to FC) and associated blocks such as the DAC 40. In addition, monitoring the bin widths to control the delay elements to for uniform code density may require alterations to the FIG. 3 example.

One further guideline is that the total delay time could not be greater than the sampling period T. Another is that a constraint may be posed by a possible overhead in accurately generating different control voltages to maintain uniform bit density, as described in greater detail in later sections.

Example Feedback Calibration for Uniform Bit Density

As described above in reference to specific examples such as FIG. 1, the delay elements such as CDs 14A and 14B effectively determine the positions of the midpoints and, therefore, the interpolated ADC quantization levels in the voltage domain. If the delay provided by, for example, CDs 14A and 14B is too long or too short the quantization midpoints are not at the actual voltage bisecting points. Therefore, the voltage bins will not have uniform width.

Various exemplary embodiments provide novel feedback calibration including automatically adjusting the delays, e.g., the control signals FC driving CDs 14A and 14B, to drive the quantization midpoints to provide uniform bin width.

According to various exemplary embodiments, static ADC errors or, in other words, shifting of the quantization levels from their ideal locations is analyzed statistically using, according to one aspect, a detection of the code density. One example includes a detection of code density having, in combination, creating of a bin for each possible digital output code value and collecting the number of occurrences of that code into the corresponding bin during a certain time period.

As will be apparent to persons skilled in the art, the time is preferably long enough to obtain a statistically significant number of hits in every bin. Regarding the specific length of time, persons skilled in the relevant art can readily determine this, in a manner appropriate and sufficient for a given application, based on reading this disclosure and applying conventional know-how possessed by such persons to the subject matter it discloses.

According to various exemplary embodiments, comparison of the number of hits in adjacent bins is performed, generating information indicative of the relative widths of the gaps between the corresponding quantization levels. Ideally the quantization levels are uniformly spaced and the bins have nearly equal number of hits.

It will be understood that the calibration exhibited by various implementations may provide a quantization calibration that may have a constraint arising from a non-uniformity of the statistics of the input signal. As one example, even if an ADC has perfect calibration and linearity, the code density over the whole ADC output code range can be flat only if the input signal to the ADC has uniform voltage distribution. With most real world signals this is not true. However, most signals produce relatively uniform code density in a small local scale spanning over only a few bins.

Exceptions, as such as a direct current (DC) signal, or a signal whose frequency is relatively low compared to the observation period, or a signal with very small amplitude, may be capable of being identified. However, these are not deemed relevant to actual practice of the invention, or an understanding of its concepts. Accordingly, for purposes of focusing the description on the novel concepts enabling persons skilled in the art to practice the invention, the embodiments are described assuming that the code density is practically flat locally.

Figure 2:
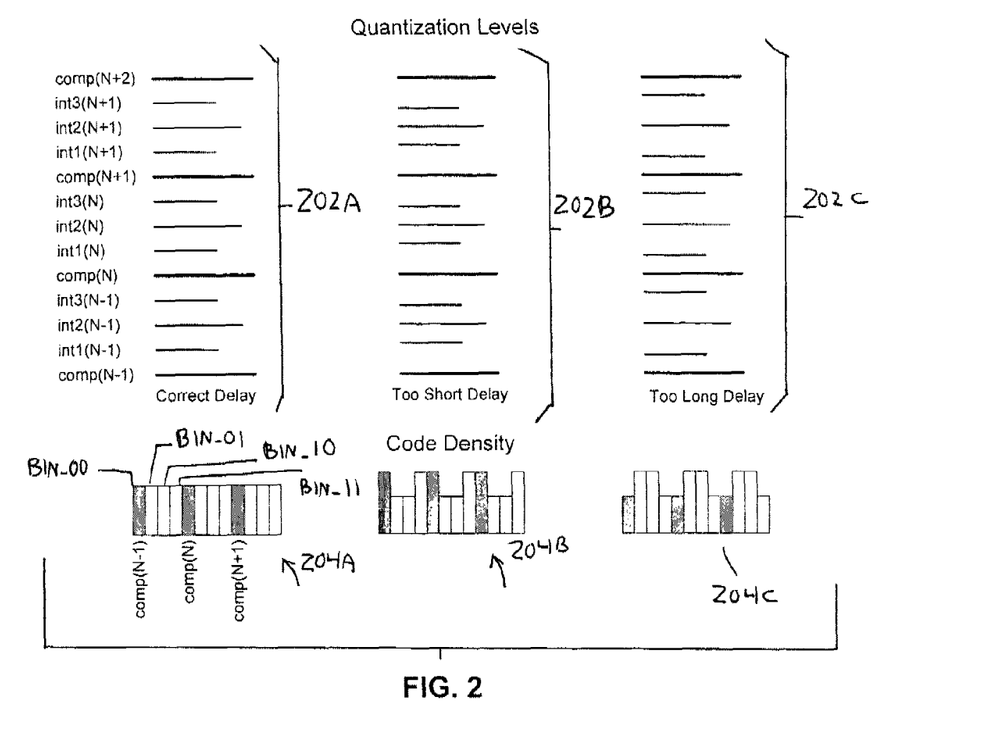
FIG. 2 shows example quantization levels and densities for a correct delay, attained with flash ADC having time interpolation sub-quantization with negative feedback calibration, and showing examples of undesired variations in delays.

FIG. 2 shows example quantization levels and densities for a correct delay, attained with flash ADC having time interpolation sub-quantization with negative feedback calibration, and showing example undesired variations in delays. Referring to FIG. 2, 202A shows the quantization levels obtained when the delays are correct. 202A shows quantization states that may be achieved by, for example, a stack of three circuits in accordance with, or equivalent to, the FIG. 1 example 10. As will be understood, exemplary embodiments of the invention automatically drive the system state to that represented in 202A.

Referring to FIG. 2, when the delay is correct the code density, labeled 204B, is flat. To illustrate the code density resulting from the delay being too long or too short, one four bin range is selected, starting from a comparator bin, labeled BIN__00, and ending at a bin associated with level three interpolator, labeled BIN__11, such as AT3 of FIG. 1. As can be seen at 202B, the delay being too short makes the two outermost bins (BIN__00 and BIN__11) associated with the comparator (e.g. signal level comparator $12_n$ of FIG. 1) and the third interpolator (e.g., AT3 of FIG. 1) higher, and makes the two middle bins (BIN__01 and BIN__10), which are associated with the first and second interpolator (e.g., AT1 and AT2) lower.

Referring still to FIG. 2, at 202C and 204C, it is seen that when the delay is too long, the opposite happens.

Various exemplary embodiments provide, among other features and benefits, variable delay units, such as CDs 14A and 14B of FIG. 1, and enclosing these in a negative feedback loop having a detection that generates an error indicative of non-uniformity, and feeds the error back to drive the variable delay units in a direction lessening the error.

According to one aspect, looking at a local code density, which may be a combined number of hits in the two outer bins relatively to the combined number of hits in the two middle bins, the delay is adjusted until the bin heights are the same.

According to one aspect, a digital counter is incremented every instance that the ADC output code falls to a bin that is one of the outer bins of a group of four and, is decremented every instance the sample falls in one of the middle bins. This aspect provides, among other features and benefits, for a single counter to monitor a balance between the inner bins and outer bins for the whole ADC. As can be understood, this aspect provides this because when the delay is correct (bin height equal) the counter output is, on the average, zero.

Figure 3:
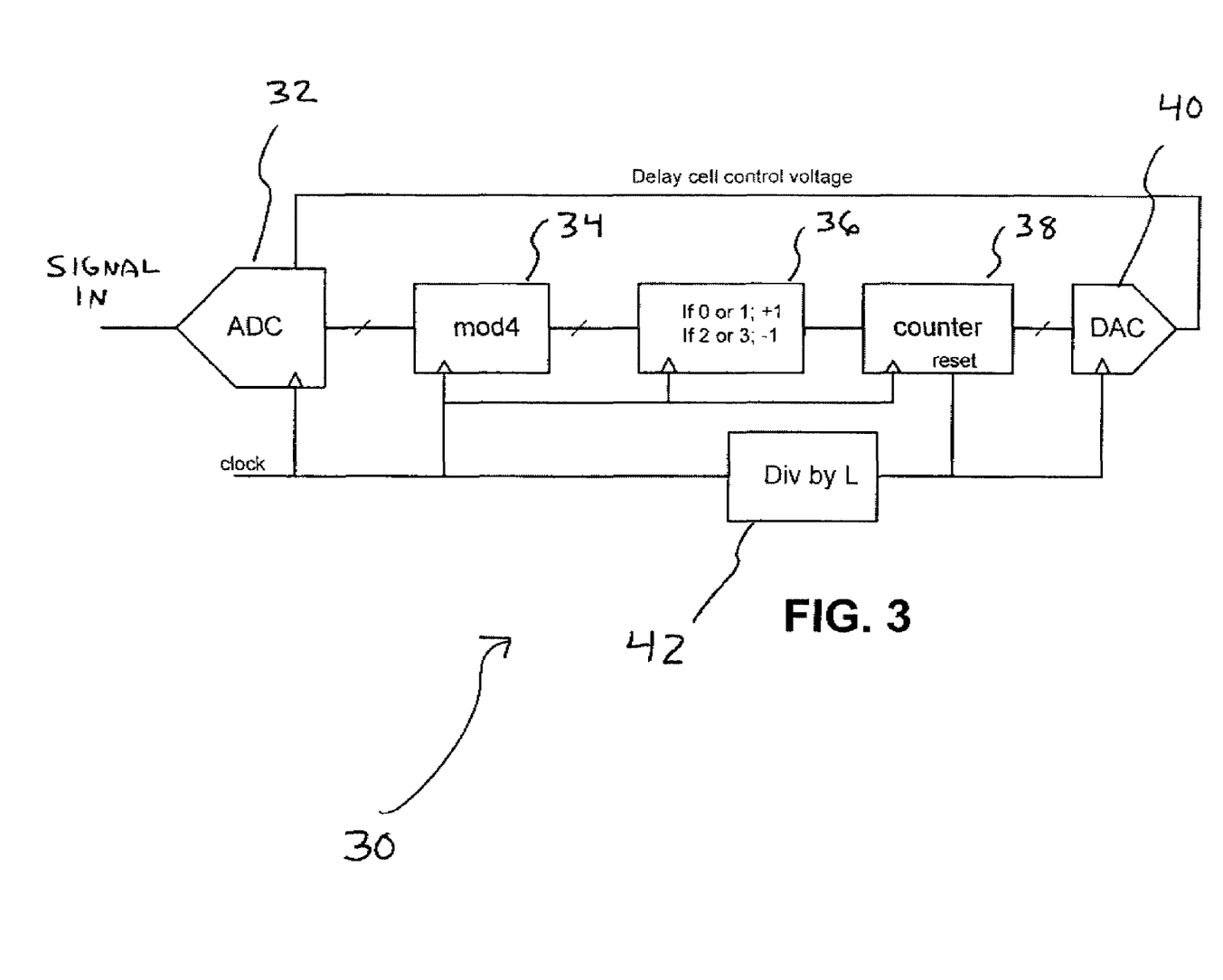
FIG. 3 shows a functional block diagram of one example negative feedback calibration according to one embodiment.

FIG. 3 shows a functional block diagram of one example negative feedback calibration 30 according to one embodiment. The FIG. 3 example 30 includes a flash ADC 32 according to any of the disclosed M-bit flash ADC embodiments such as, for example, a combination of the FIG. 1 example 10 arrangements, a modulo-4 event detector 34, a counter increment/decrement unit 36, a counter 38, a digital-to-analog converter (DAC) 40 and a divide-by-L reset unit 42.

Referring to FIG. 3, according to one aspect, the modulo 4 event detector 34 detects operation of the binary output of the ADC 32 and, in one example, if it is a binary 1 or binary 0 sample as shown at FIG. 2, item 204A, the sample is in the outer bins, such as BIN__00 or BIN__11 and the counter 36 is incremented. If it a binary 2 or binary 3 sample, it is in the inner bins, such as BIN_01 or BIN 10 and the counter 36 is decremented.

The output of the counter 36 is fed back to control the delay, e.g., the CDs 14A and 14B of FIG. 1. The clock divider (div by L) 42 determines the time interval during which the signal statistics are collected. At the end of this period the counter output is sampled by the DAC 40 and the counter 38 is reset and a new interval begins. In an implementation where the delay cell has a digital control the DAC is replaced with a register stage.

If the delays such as 14A and 14B have a digital control the counter 36 output may be directly used (not shown in FIG. 3) to control such delays. In the alternative, CDs such as 14A and 14B have an analog control voltage, such as FC of FIG. 1, which can be generated using a slow speed D/A converter (DAC) 40 such as, for example, a delta-sigma architecture DAC.

Although the various exemplary embodiments have been described in detail with particular reference to certain exemplary aspects thereof, it should be understood that the invention is capable of other embodiments and its details are capable of modifications in various obvious respects.

For example, in some applications, a better quality code density statistic may be obtained by looking at only a subset of bins in the middle of the ADC output code range, for instance bins from ¼ of the range to ¾ of the range. Since in many applications the signal statistics, in terms of probability density, are generally concentrated in that range, the code density is more uniform and, therefore, a more uniform density of hits per bin.

Another example variation is that, for controllability of performance in an environment of non-qualifying input signals (with respect to amplitude density) such as, for example, DC, is that an implementation may include an activity detector (not shown) that suspends the delay value updates (e.g., generation of an updated FC value), until the signal is detected as active again.

As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We hereby claim:

1. A flash analog-to-digital converter, comprising:
a flash comparator portion to compare an input signal to $2^N-1$ reference voltages and to generate $2^N-1$ corresponding binary valued comparison signals, wherein adjacent comparison signals represent a given least significant bit quantization level;
a time interpolating encoder to detect a difference in arrival time between a first comparison signal and a second comparison signal from among the binary valued comparison signals and, based on the difference, to generate a voltage interpolation signal capable of encoding a plurality of bins within the given least significant bit quantization level, and capable of identifying which of the bins corresponds to the input signal, wherein the time interpolating decoder includes at least one variable delay unit to delay, based on a feedback control signal, at least one of the first comparison signal and the second comparison signal prior to detecting said difference;
a decoder to generate M-bit output data representing an M-bit quantization of the input signal, wherein M is an integer greater than N, based on the binary valued comparison signals and the voltage interpolation signal;
a feedback control signal generator to generate the feedback control signal, the generator including a code density detector to detect a non-uniformity of a code density of the M-bit output data, wherein the generator generates the control signal based on the detecting.

2. The flash analog-to-digital converter of claim 1, wherein the time interpolating encoder varies the width of the bins based on the delay of the variable delay unit.

3. The flash analog-to-digital converter of claim 1, wherein the decoder generates N bits of the M-bit output data based on the $2^N-1$ corresponding binary valued comparison signals and K bits of the M-bit output data are based on the voltage interpolation signal, wherein each of the K bits represents a sub-quantization level smaller that said given least significant bit quantization level.

4. The flash analog-to-digital converter of claim 3,
wherein there are $2^K$ of said bins within said given least significant bit quantization level,
wherein said K bits are capable of encoding $2^K$ states of said $2^K$ bins,
wherein the feedback control signal generator code density detector includes a counter for counting the uniformity of occurrences among all of the states capable of being represented by the K bits and generating a corresponding counting result, and
wherein the generator generates the control signal based on said counting result.

5. The flash analog-to-digital converter of claim 3, further comprising:
a multi-level feedback control signal generator for generating, based on said feedback control signal, $2^{K-1}-1$ lower level feedback control signals, and
wherein said flash comparator portion includes a first signal level comparator to compare, in response to a sample clock, the input signal to a first reference voltage and to generate a corresponding first comparison signal at a first delay time, the first delay time indicative of the difference between the input signal and the first reference voltage, and includes a second signal level comparator to compare, in response to the sample clock, the input signal to a second reference voltage and to generate a corresponding second comparison signal at a second delay time, the second delay time indicative of the difference between the input signal and the second reference voltage,
wherein the time interpolating encoder includes
a first controllable delay for concurrently generating $2^{K-1}-1$ different delays of said first comparison signal, based on said $2^{K-1}-1$ lower level feedback control signals,
a second controllable delay for concurrently generating $2^{K-1}-1$ different delays of said second comparison signal, based on said $2^{K-1}-1$ lower level feedback control signals,
a multi-level delay time of arrival detector to detect a difference between the first delay time and the second delay time, to detect a difference between the first delay time and a respective occurrence of each of said $2^{K-1}-1$ different delays of said second comparison signal, and to detect a difference between the second delay time and a respective occurrence of each of said $2^{K-1}-1$ different delays of said first comparison signal, and based on said detecting, to generate $2^{K-1}$ voltage interpolation signals,
wherein said first comparison signal, said second comparison signal, and said $2^{K-1}$ voltage interpolation signals represent $2^K$ bins within said least significant bit quantization level.

6. The flash analog-to-digital converter of claim 1,
wherein said flash comparator portion includes a first signal level comparator to compare, in response to a sample clock, the input signal to a first reference voltage and to generate a corresponding first comparison signal at a first delay time, the first delay time indicative of the difference between the input signal and the first reference voltage, and includes a second signal level comparator to compare, in response to the sample clock, the input signal to a second reference voltage and to generate a corresponding second comparison signal at a second delay time, the second delay time indicative of the difference between the input signal and the second reference voltage,
wherein the time interpolating encoder includes a first time of arrival detector to detect the difference between the first delay time and the second delay time and to generate, based on said detected difference, a first voltage interpolation signal of said voltage interpolation signals, said first voltage interpolation signal having a binary state representing a sub-quantization level one half of said least significant bit quantization level.

7. The flash analog-to-digital converter of claim 6, wherein said second signal level comparator is capable of outputting a negative second comparison signal substantially concurrent with said second comparison signal, and
wherein said time interpolating encoder further comprises:
a controllable first delay unit to receive the feedback control signal and the negative second comparison signal and to generate a delayed negative second comparison signal, having a delay relative to said negative second comparison signal based on said delay control signal, and
a second time of arrival detector to detect the difference between the first delay time and an occurrence of the delayed negative second comparison signal, to generate, based on said detected difference, a second voltage interpolation signal of said voltage interpolation signals, said second voltage interpolation signal having a binary state representing a first and a second of a plurality of sub-bins within said second quantization level, each of said sub-bins representing approximately one half of said sub-quantization level.

8. The flash analog-to-digital converter of claim 7, wherein said time interpolating encoder further comprises:
a controllable second delay unit to receive the feedback control signal and the first comparison signal and to generate a delayed first comparison signal, having a delay relative to said first comparison signal based on said delay control signal, and
a third time of arrival detector to detect the difference between the second delay time and an occurrence of the delayed first comparison signal to generate, based on said detected difference a third voltage interpolation signal of said voltage interpolation signals, said third voltage interpolation signal representing a third and a fourth of said sub-bins.

9. A flash analog-to-digital converting method, comprising:
comparing an input signal to $2^N-1$ reference voltages;
generating $2^N-1$ corresponding binary valued comparison signals, based on the comparing, wherein adjacent comparison signals represent a given least significant bit quantization level;
detecting a difference in arrival time between a first comparison signal and a second comparison signal from among the binary valued comparison signals and, based on the difference, generating a first-to-arrive signal, wherein the detecting includes delaying at least one of the first comparison signal and the second comparison signal prior to detecting said difference;
generating a voltage interpolation signal capable of encoding a plurality of bins within the given least significant bit quantization level, and capable of identifying which of the bins corresponds to the input signal, said generating based on said first-to-arrive signal;
generating an M-bit output data representing an M-bit quantization of the input signal, based on the binary valued comparison signals and the voltage interpolation signal;
detecting a non-uniformity of a code density of the M-bit output data and generating a corresponding uniformity error data;
generating a feedback control signal based on the uniformity error data; and
varying said delaying based on said feedback control signal.

10. The flash analog-to-digital converting method of claim 9, wherein said generating a voltage interpolation signal generates said feedback control signal to vary the width of the bins based on the said delay.

11. The flash analog-to-digital converting method of claim 9, wherein said generating an M-bit output data generates K bits of the M-bit output data based on the voltage interpolation signal.

12. The flash analog-to-digital converting method of claim 11,
wherein there are $2^K$ of said bins within said given least significant bit quantization level,
wherein said K bits are capable of encoding $2^K$ states of said $2^K$ bins,
wherein said code density detecting includes counting the uniformity of occurrences among all of the states capable of being represented by the K bits and generating a corresponding counting result, and
wherein said generating the control signal is based on said counting result.

13. The flash analog-to-digital converting method of claim 11, wherein said generating a feedback control signal includes generating $2^{K-1}-1$ lower level feedback control signals, and further comprising:
generating $2^{K-1}-1$ different delays, concurrently, of said first comparison signal, based on said $2^{K-1}-1$ lower level feedback control signals;
generating $2^{K-1}-1$ different delays, concurrently, of said second comparison signal, based on said $2^{K-1}-1$ lower level feedback control signals; and
generating $2^{K-1}-1$ voltage interpolation signals, said generating based on detecting a difference between the first delay time and the second delay time,
detecting a difference between the first delay time and a respective occurrence of each of said $2^{K-1}-1$ different delays of said second comparison signal and detecting a difference between the second delay time and a respective occurrence of each of said $2^{K-1}-1$ different delays of said first comparison signal,
wherein said first comparison signal, said second comparison signal, and said $2^{K-1}$ voltage interpolation signals represent 2K bins within said least significant bit quantization level.

14. The flash analog-to-digital converting method of claim 9,
wherein comparing the input signal to $2^N-1$ reference voltages includes comparing, in response to a sample clock, the input signal to a first reference voltage, and generating, based on said comparing, a corresponding first comparison signal at a first delay time, the first delay time indicative of the difference between the input signal and the first reference voltage, comparing, in response to the sample clock, the input signal to a second reference voltage and to generating, based on said comparing, a corresponding second comparison signal at a second delay time, the second delay time indicative of the difference between the input signal and the second reference voltage, wherein the time interpolating encoding includes detecting the difference between the first delay time and the second delay time, and generating, based on said detected difference, a first voltage interpolation signal of said voltage interpolation signals, said first voltage interpolation signal having a binary state representing a sub-quantization level one half of said least significant bit quantization level.

15. The flash analog-to-digital converter of claim 14, wherein said time interpolating encoding further comprises:

generate a delayed first comparison signal, having a delay relative to said first comparison signal based on said feedback control signal, detecting the difference between the second delay time and an occurrence of the delayed first comparison signal, and generating, based on said detected difference, a third voltage interpolation signal of said voltage interpolation signals, said third voltage interpolation signal representing a third and a fourth of said sub-bins.

* * * * *